(12) United States Patent
Huang (10) Patent No.: US 7,279,992 B2
(45) Date of Patent: Oct. 9, 2007

(54) CIRCUIT FOR DETECTING PHASE ERRORS AND GENERATING CONTROL SIGNALS AND PLL USING THE SAME

(75) Inventor: Chen-Chih Huang, Hsin Chu County (TW)

(73) Assignee: Realtek Semiconductor Corp., Hsinchu (TW)

( * ) Notice: Subject to any disclaimer, the term of this patent is extended or adjusted under 35 U.S.C. 154(b) by 68 days.

(21) Appl. No.: 11/188,626

(22) Filed: Jul. 26, 2005

(65) Prior Publication Data

US 2006/0017512 A1    Jan. 26, 2006

(30) Foreign Application Priority Data

Jul. 26, 2004    (TW) ............... 93122233 A (51) Int. Cl.
*H03L 7/00* (2006.01)
(52) U.S. Cl. ......................... 331/25; 331/1 A
(58) Field of Classification Search ............... 331/1 A
See application file for complete search history.

(56) References Cited

U.S. PATENT DOCUMENTS

| 5,266,907 | A | * | 11/1993 | Dacus | .......................... 331/1 A |
| 5,552,727 | A | * | 9/1996 | Nakao | .......................... 327/159 |
| 6,259,278 | B1 | | 7/2001 | Huang | |

* cited by examiner

*Primary Examiner*—Joseph Chang
(74) *Attorney, Agent, or Firm*—Birch, Stewart, Kolasch & Birch, LLP (57) ABSTRACT

A circuit for detecting phase errors and generating control signals includes a digital phase detector and a digital filter. The digital phase detector receives an input signal and a reference signal and generates a set of phase error control signals, and the digital filter receives the phase error control signals to generate control data. The digital filter can include a lookup table, an adder, and a register. The lookup table receives the phase error control signals and outputs a lookup value. The adder receives the lookup value and a register value and generates the control data. The register receives and stores the control data and outputs the stored control data as the register value.

31 Claims, 9 Drawing Sheets

|  | Up1 | Up2 | Up3 | Up4 | Up5 | Dn1 | Dn2 | Dn3 | Dn4 | Dn5 | CV |
|---|---|---|---|---|---|---|---|---|---|---|---|
| S1 | 1 | 0 | 0 | 0 | 0 | 0 | 0 | 0 | 0 | 0 | 1 |
| S2 | 0 | 1 | 0 | 0 | 0 | 0 | 0 | 0 | 0 | 0 | 2 |
| S3 | 0 | 0 | 1 | 0 | 0 | 0 | 0 | 0 | 0 | 0 | 4 |
| S4 | 0 | 0 | 0 | 1 | 0 | 0 | 0 | 0 | 0 | 0 | 8 |
| S5 | 0 | 0 | 0 | 0 | 1 | 0 | 0 | 0 | 0 | 0 | 16 |
| S6 | 0 | 0 | 0 | 0 | 0 | 1 | 0 | 0 | 0 | 0 | -1 |
| S7 | 0 | 0 | 0 | 0 | 0 | 0 | 1 | 0 | 0 | 0 | -2 |
| S8 | 0 | 0 | 0 | 0 | 0 | 0 | 0 | 1 | 0 | 0 | -4 |
| S9 | 0 | 0 | 0 | 0 | 0 | 0 | 0 | 0 | 1 | 0 | -8 |
| S10 | 0 | 0 | 0 | 0 | 0 | 0 | 0 | 0 | 0 | 1 | -16 |

CIRCUIT FOR DETECTING PHASE ERRORS AND GENERATING CONTROL SIGNALS AND PLL USING THE SAME

This application claims the benefit of the filing date of Taiwan Application Ser. No. 093122233, filed on Jul. 26, 2004, the content of which is incorporated herein by reference.

BACKGROUND OF THE INVENTION

1. Field of the Invention

The invention relates to a circuit used in a phase-locked loop (hereinafter referred to PLL) or a delay-locked loop (hereinafter referred to DLL) for detecting phase errors and generating control signals, and more particularly, to a circuit for detecting phase errors and generating control signals through digital processing.

2. Description of the Related Art

Figure 1:
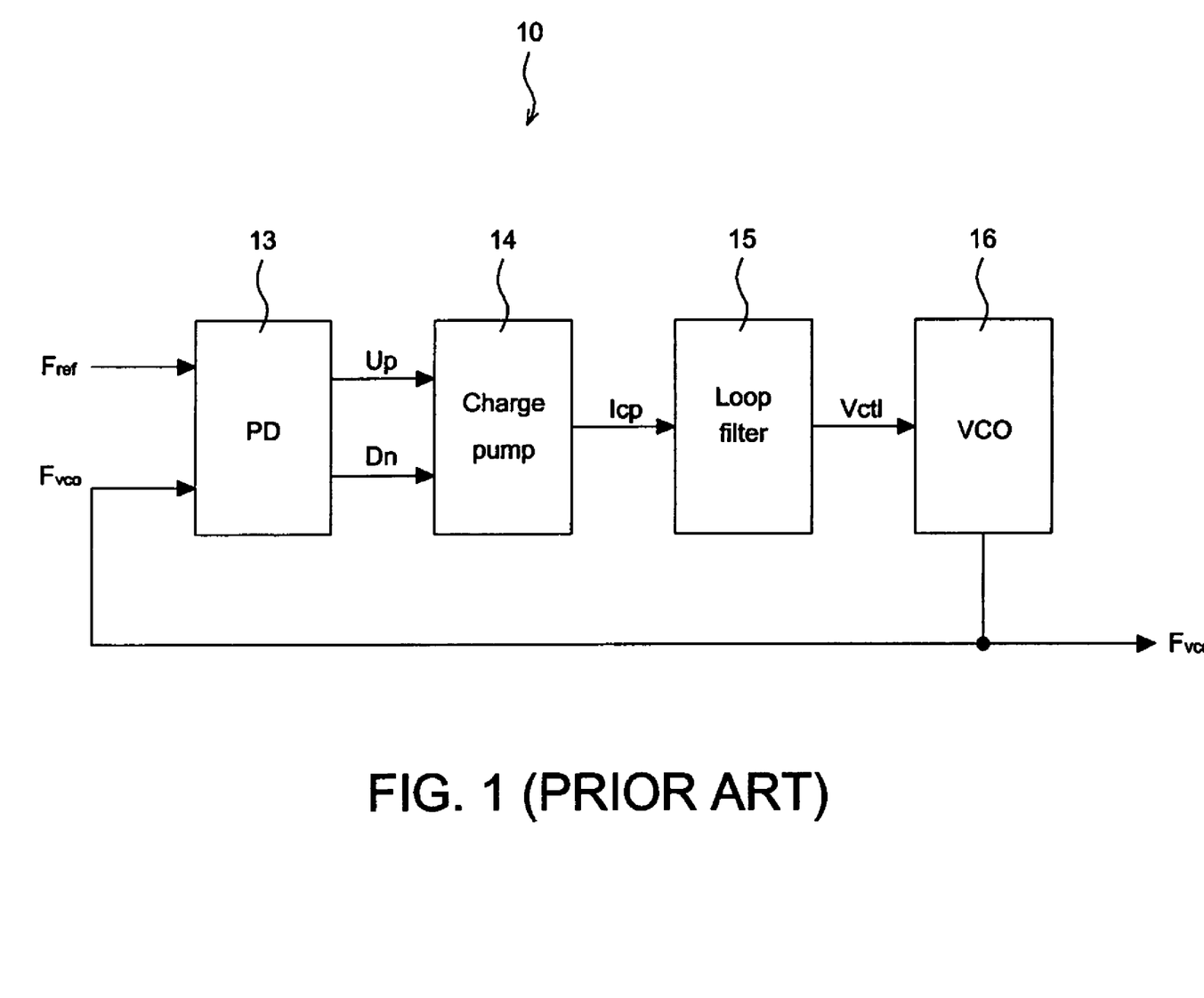
FIG. 1 shows a block diagram illustrating a conventional PLL.

A typical PLL may be a digital PLL or an analog PLL. FIG. 1 shows an analog phase detector used in a PLL, and FIG. 2 shows a digital phase detector used in a PLL.

The PLL 10 shown in FIG. 1 includes a phase detector (PD) 13, a charge pump 14, a loop filter 15, and a voltage-controlled oscillator (VCO) 16. The phase detector 13 detects the phase difference between an input signal $F_{ref}$ and a phase-locked clock $F_{vco}$ and then outputs control pulses Up and Dn according to the phase difference to control the charge pump 14. For example, when the phase of the phase-locked clock $F_{vco}$ leads the phase of the input signal $F_{ref}$, the width of the pulse Up output by the phase detector 13 is smaller compared with the width of the pulse Dn to result in a negative control current Icp generated by the charge pump 14. Meanwhile, the loop filter 15 reduces a control voltage Vctl to decrease the frequency of the phase-locked clock $F_{vco}$ output by the voltage-controlled oscillator 16. On the contrary, when the phase of the phase-locked clock $F_{vco}$ lags behind the phase of the input signal $F_{ref}$, the width of the pulse Up output by the phase detector 13 is larger compared with the width of the pulse Dn to result in a positive control current Icp generated from the charge pump 14. Meanwhile, the loop filter 15 raises the control voltage Vctl to increase the frequency of the phase-locked clock $F_{vco}$ output by the voltage-controlled oscillator 16.

Figure 2:
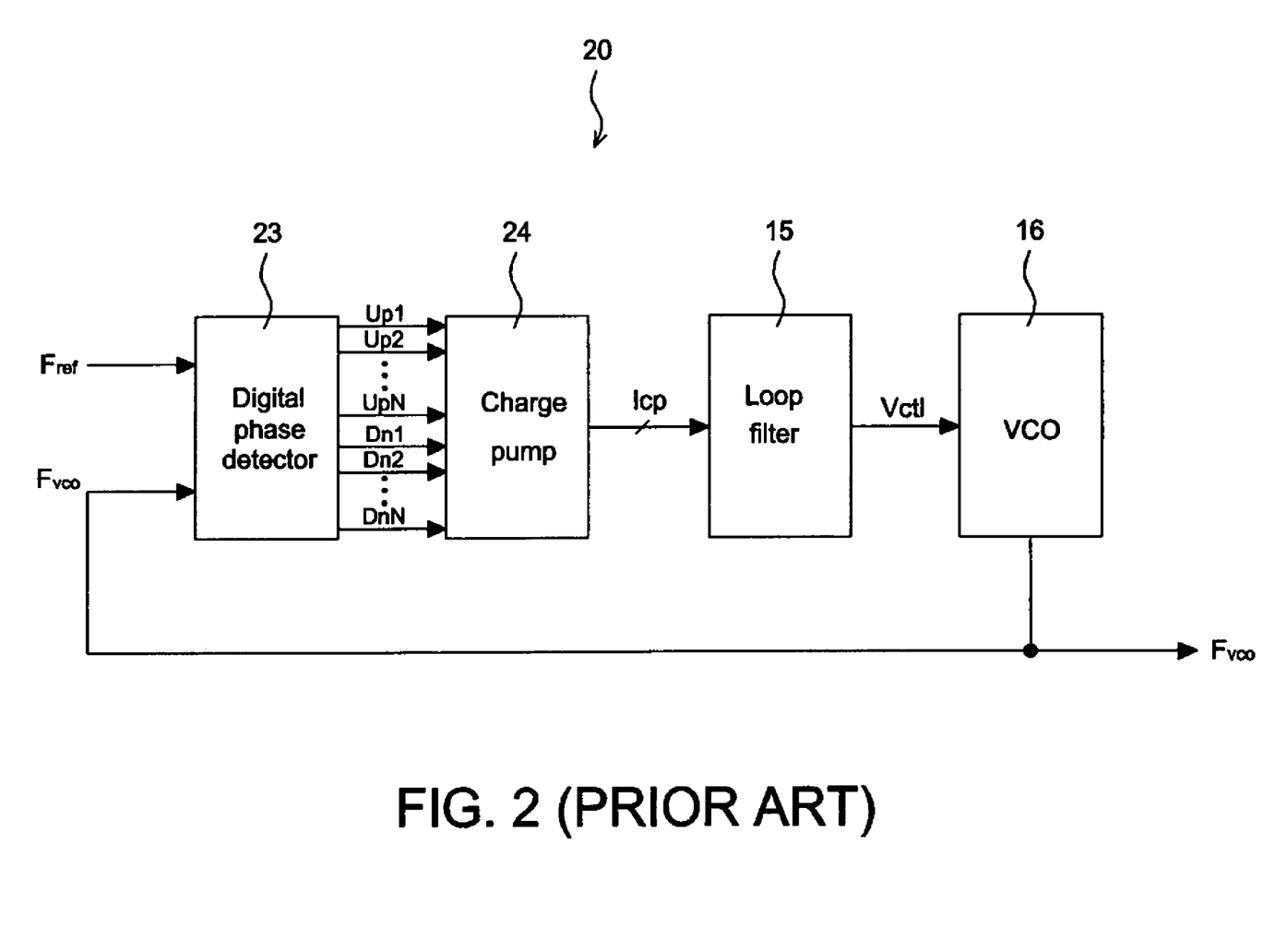
FIG. 2 shows a block diagram illustrating another conventional PLL.

FIG. 2 shows a PLL 20 including a digital phase detector 23, a charge pump 24, a loop filter 15, and a voltage-controlled oscillator (VCO) 16, where the digital phase detector 23 has been disclosed in U.S. Pat. No. 6,259,278. The digital phase detector 23 generates a set of phase error control signals Up1-UpN and Dn1-DnN through digital processing and transmits them to the charge pump 24. Then, the charge pump 24 generates a control current Icp that is to be transmitted to the loop filter 15 for generating a control voltage Vctl. The operating principle of the PLL 20 is the same as the PLL 10, except the signals generated by the digital phase detector 23 are digital signals. Such difference allows a better detection for the PLL 20 to eliminate the dead zone, reduce the clock jitter, and enhance the jitter tolerance of the data random jitter.

However, the output signals of the loop filter 15 of the PLL 20 are still analog signals, and a considerable occupied area is needed for the loop filter 15 since it is a low-pass filter.

SUMMARY OF THE INVENTION

In view of the above-mentioned problems, an object of the invention is to provide a digital circuit for detecting phase errors and generating control signals, which allows for decreasing the chip area of a PLL incorporating the digital circuit.

To achieve the above-mentioned object, the circuit for detecting phase errors and generating control signals includes a digital phase detector and a digital filter. The digital phase detector receives an input signal and a reference signal and generates a set of phase error control signals, and the digital filter receives the phase error control signals to generate control data. The digital filter includes a lookup table, an adder, and a register. The lookup table receives the phase error control signals and outputs a lookup value. The adder receives the lookup value and a register value and generates the control data. The register receives and stores the control data and outputs the stored control data as the register value.

DETAILED DESCRIPTION OF THE INVENTION

A circuit for detecting phase errors and generating control signals and a phase-locked loop and delay-locked loop incorporating the circuit will be described with reference to the accompanying drawings.

Figure 3:
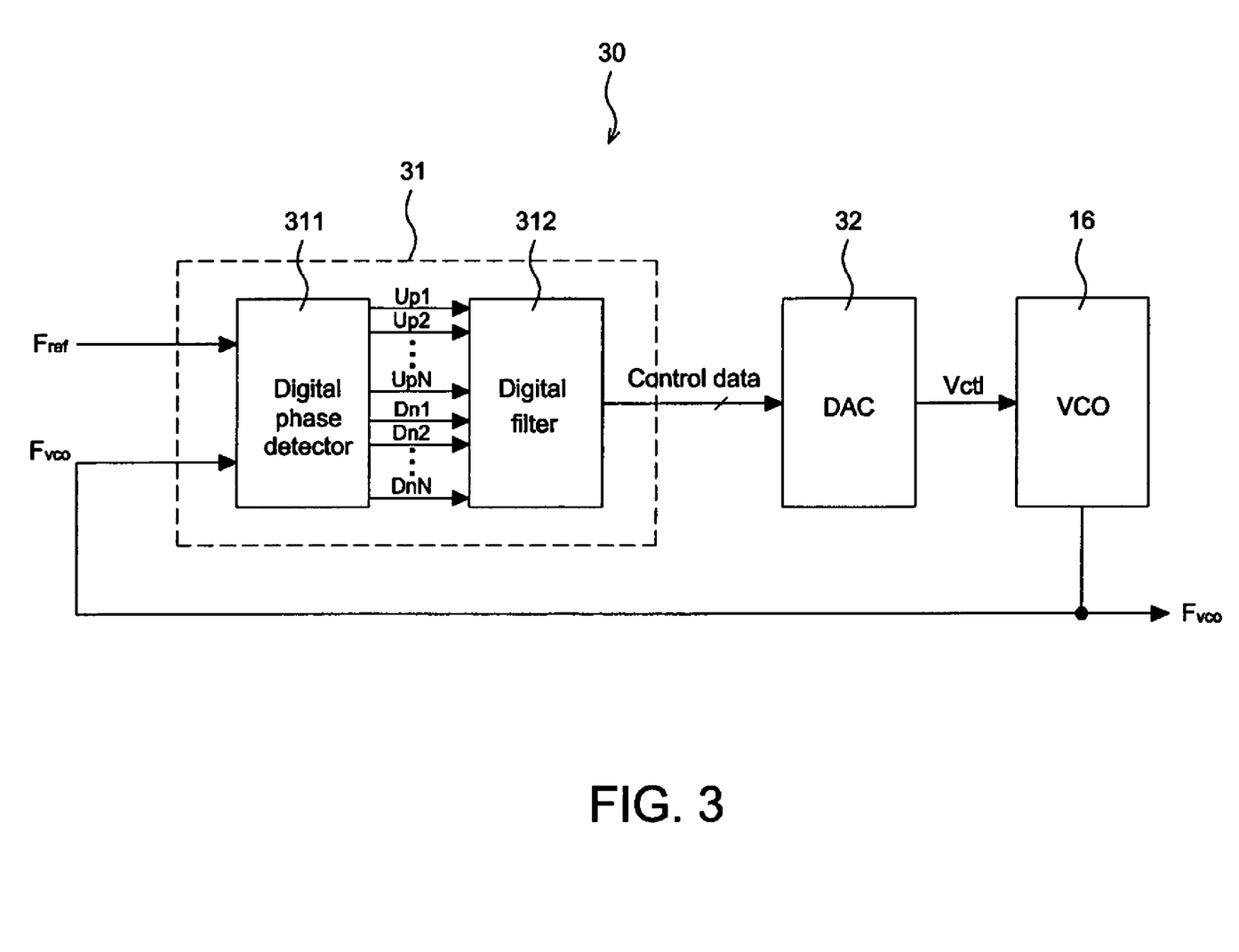
FIG. 3 shows a block diagram illustrating a PLL according to the invention.

FIG. 3 shows a block diagram illustrating a PLL incorporating a circuit for detecting phase errors and generating control signals. Referring to FIG. 3, the PLL 30 includes a circuit 31 used for detecting phase errors and generating control signals (hereinafter referred to as a phase measuring circuit 31), a digital-to-analog converter (DAC) 32, and a voltage-controlled oscillator 16. The phase measuring circuit 31 receives a reference signal $F_{ref}$ and an oscillation clock $F_{vco}$ to generate control data after comparing the phase difference between them. Then, the PLL 30 transforms the control data into a control voltage Vctl by the DAC 32 to control the VCO 16. Since the control data is generated digitally in the PLL 30, the PLL 30 according to the invention is improved in the control accuracy to ensure the noise immunity.

Note that the PLL in FIG. 3 may also be provided for the purpose of locking a clock signal, and the reference signal $F_{ref}$ is chosen from a clock signal. Also, the PLL may be applied to a data recovery circuit, and the reference signal $F_{ref}$ is chosen from input data.

The phase measuring circuit 31 includes a digital phase detector 311 and a digital filter 312. The digital phase detector 311 receives the reference signal $F_{ref}$ and the oscillation clock $F_{vco}$ and compares their phases to generate a set of phase error control signals Up1-UpN and Dn1-DnN. The circuit architecture of the digital phase detector 311 has been disclosed in U.S. Pat. No. 6,259,278, thus not described here in detail.

Figure 4:
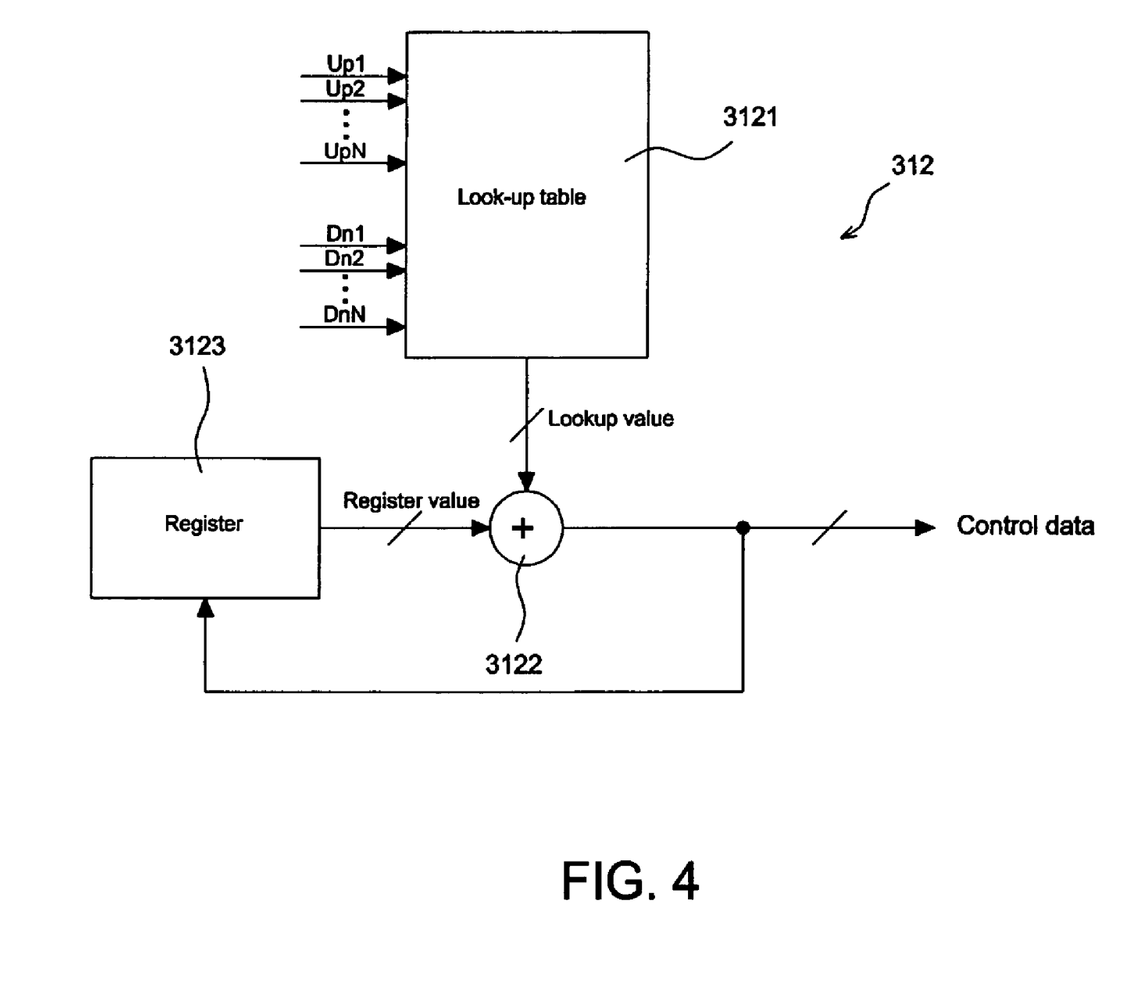
FIG. 4 illustrates a block diagram of the digital filter shown in FIG. 3.

FIG. 4 illustrates a block diagram of the digital filter 312 shown in FIG. 3. Referring to FIG. 4, the digital filter 312 generates control data according to the phase error control signals Up1-UpN and Dn1-DnN transmitted from the digital phase detector 311. The digital filter 312 includes a lookup table 3121, an adder 3122, and a register 3123.

The lookup table 3121 is used to output a lookup value after receiving the phase error control signals Up1-UpN and Dn1-DnN. The adder 3122 receives the lookup value and a register value and generates control data. The register 3123 receives and stores the control data and then outputs the stored control data as the register value. The lookup table 3121 may be implemented by a memory, with the phase error control signals Up1-UpN and Dn1-DnN being address signals. Alternatively, the lookup table 3121 may be composed of logic gates having output that conforms to a specification shown in FIG. 5. Note that the values listed in FIG. 5 are just for illustrating purpose, and they are determined according to the phase error control signals Up1-Upn and Dn1-DnN from the digital phase detector 311.

Figure 5:
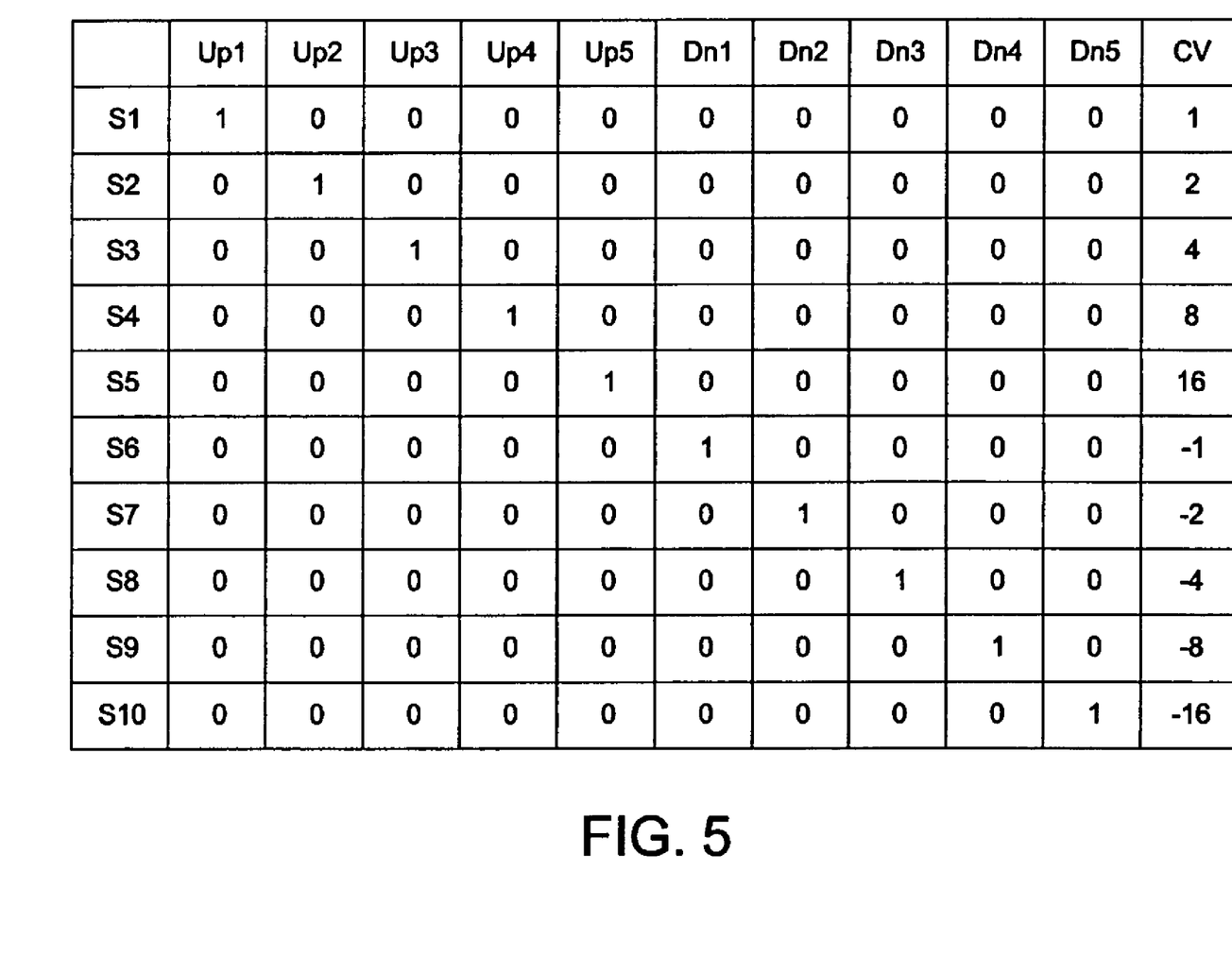
FIG. 5 shows an embodiment of the relation between phase error control signals and lookup values of a lookup table.

Referring to FIG. 5, under state S1, the phase error control signals Up1-Up5 and Dn1-Dn5 are [1000000000] and the output of the lookup table 3121 is 1, indicating that there is a slight phase lag. Under state S5, the phase error control signals Up1-Up5 and Dn1-Dn5 are [0000100000] and the output of the lookup table 3121 is 16, indicating that there is a considerable phase lag. Further, the phase error control signals Up1-Up5 and Dn1-Dn5 are [0000010000] and the output of the lookup table 3121 is -1, indicating that there is a slight phase lead. The phase error control signals Up1-Up5 and Dn1-Dn5 are [0000000001] and the output of the lookup table 3121 is -16, indicating that there is a considerable phase lead. Hence, it can be seen that the lookup table 3121 outputs a proper lookup value according to the phase error control signals Up1-Up5 and Dn1-Dn5.

Figure 6:
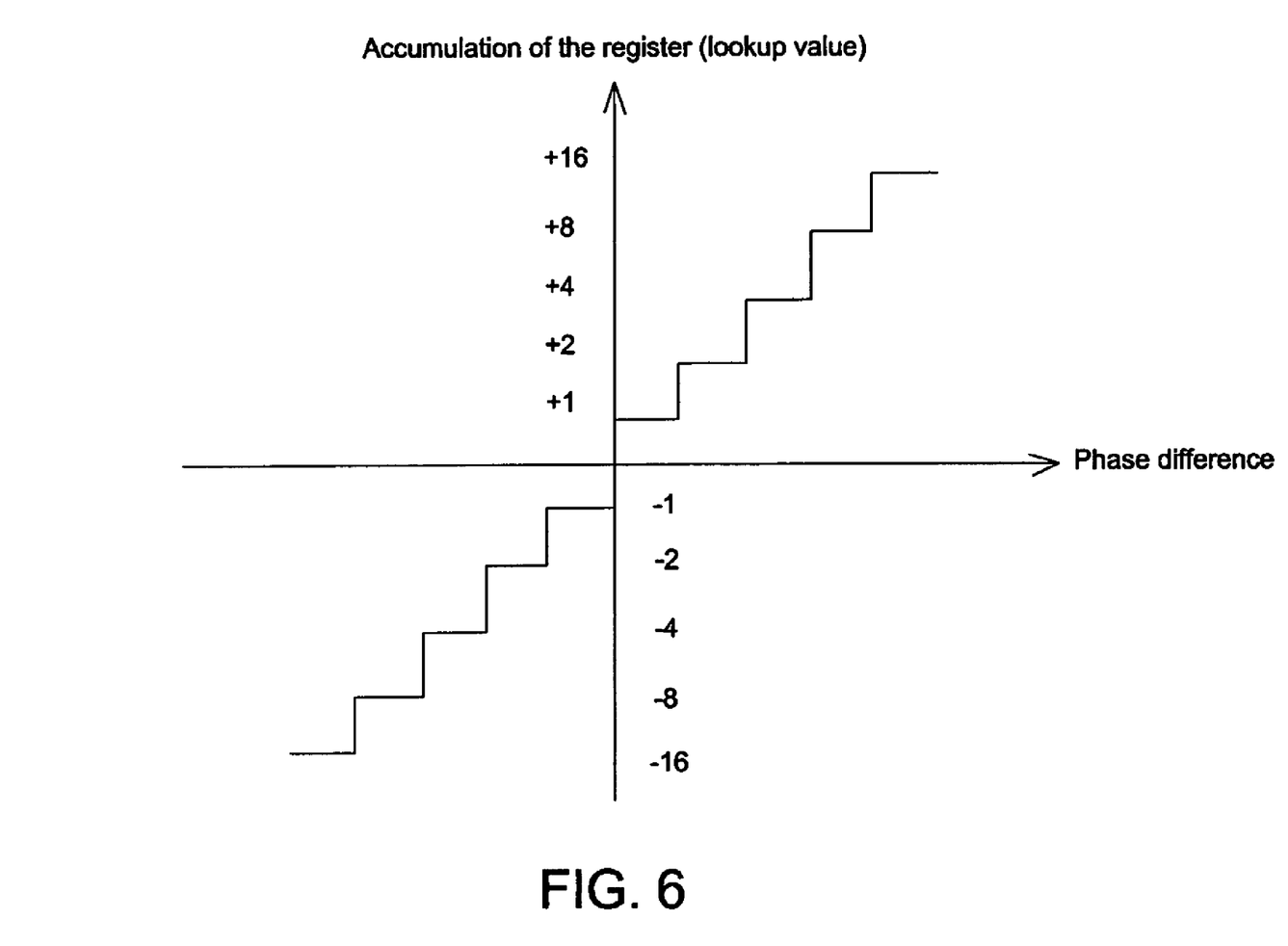
FIG. 6 shows a diagram illustrating the relation between the phase error control signals received by a digital filter and the accumulation of a register.

Further, according to the invention, the digital filter 312 whose adder 3122 and register 3123 accumulate the lookup values due to phase errors to filter out the high frequency components. FIG. 6 shows the relation between the phase error control signals and the accumulation of the register (lookup value). When there is a slight phase lag, the level of the phase error control signal Up1 is high and the lookup value is 1. Hence, the adder 3122 adds one unit to the accumulation of the register 3123. When the phase lag error increases, the level of the phase error control signal Up2 is high and the lookup value is 2. Hence, the accumulation of the register 3123 is added up to 2 through the adder 3122. When the phase lag error further increases, the level of the control signal Up3 is high and the accumulation of the register 3123 is added up to 4 through the adder 3122. When the phase lag error still increases, the level of the phase error control signal Up4 is high and the accumulation of the register 3123 is added up to 8 through the adder 3122. When there is a considerable phase lag, the level of the control signal Up5 is high and the accumulation of the register 3123 is added up to 16 through the adder 3122. As a result, the register 3123 and the adder 3122 altogether may operate as an integrator to filter out the high frequency components of the phase error. In other words, the low-pass filtering is achieved. On the other hand, similar relations and treatments also exist under the circumstance of the phase lead.

It is widely known for the persons skilled in the art that the lookup values stored in the lookup table 3121 determine the extent of the low-pass filtering, namely the distribution of the 3 dB frequency for the digital filter 312. Therefore, the lookup values may be set depending on practical applications.

The following is an example of the operation of the digital filter 312. When the digital phase detector 311 transmits a set of phase error control signals, such as sequentially high level Up2 and Up3, to the digital filter 312, the lookup table 3121 receives the phase error control signals and then outputs lookup values, such as 2 and 4 in this example. As the level of the Up2 is high, the lookup table 3121 feeds the existing lookup value 2 to the adder 3122. The adder 3122 adds the lookup value 2 to a preset register value 0, and the sum is stored in the register 3123 as a new register value 2. Meanwhile, the adder 3122 outputs the new register value 2 to the DAC 32 as the control data. Next, as the level of the Up3 is high, the lookup table 3121 feeds the existing lookup value 4 to the adder 3122. The adder 3122 adds the lookup value 4 to the existing register value 2, and the sum is stored in the register 3123 as a new register value 6. Meanwhile, the adder 3122 outputs the new register value 6 to the DAC 32 as the incoming control data. Subsequently, the digital filter 312 receives another set of phase error control signals, and similar treatments proceed.

Through the design of the invention, the lookup table 3121, the adder 3122, and the register 3123 altogether perform digital control to achieve filtering effect. Hence, compared with the conventional design, the digital filter 312 according to the invention has better noise immunity and is easy to program. Further, since the prior loop filter 15 is a low-pass filter, the occupied area of its capacitor will expand under the circumstance of a low frequency. However, when the digital filter 312 of the invention operates under a low frequency, its occupied area is apparently reduced since the capacitor used in the conventional design is replaced with several logic gates.

Figure 7:
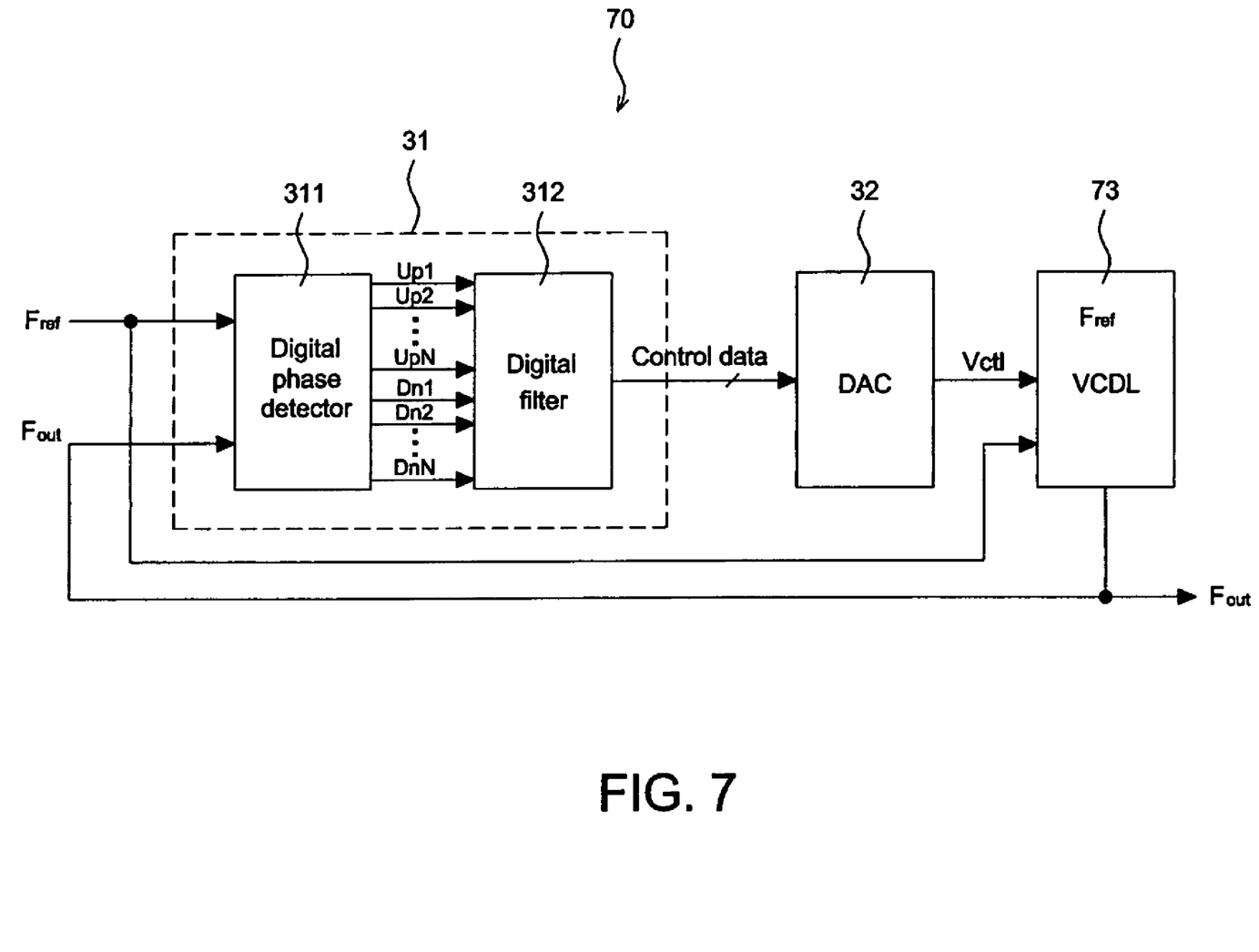
FIG. 7 shows a block diagram illustrating a DLL according to the invention.

FIG. 7 shows a block diagram illustrating a DLL incorporating a circuit for detecting phase errors and generating control signals according to the invention. The DLL in FIG. 7 is provided for the purpose of locking a clock signal. Referring to FIG. 7, the DLL includes a phase measuring circuit 31, a digital-to-analog converter (DAC) 32 and a voltage-controlled delay line 73. The DLL is different from the PLL in that the voltage-controlled delay line 73 substitutes for the VCO 16. The voltage-controlled delay line 73 receives a control voltage Vctl from the DAC 32 and a reference signal $F_{ref}$ and generates an output clock $F_{out}$. The phase measuring circuit 31 receives the reference signal $F_{ref}$ and the output clock $F_{out}$ generate control data. The DAC 32 receives the control data and generates the control voltage Vctl. The operation and circuit architecture of the phase measuring circuit 31 and the DAC 32 have been described in the foregoing, thus not explained here in detail.

Figure 8:
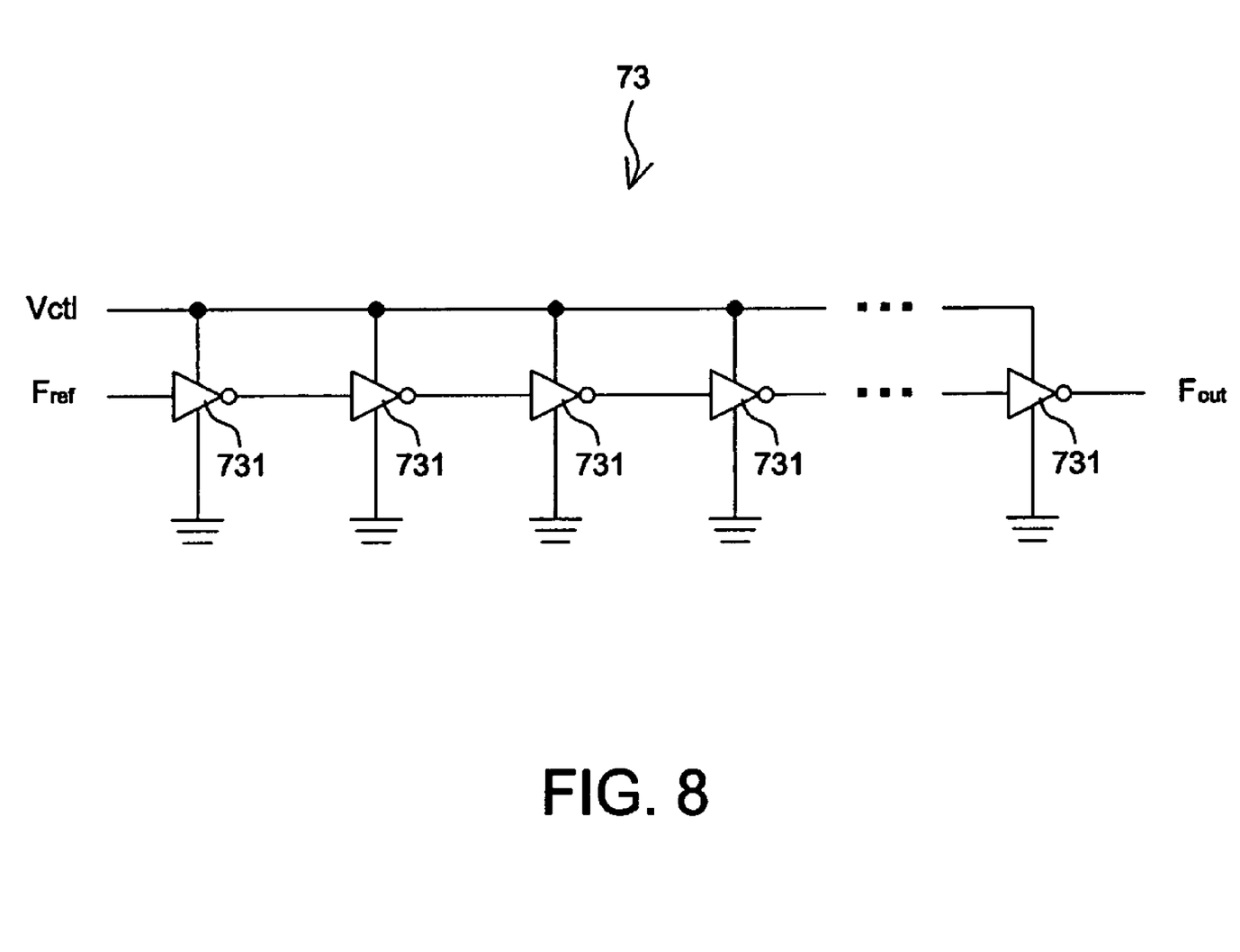
FIG. 8 shows a block diagram of the voltage-controlled delay line shown in FIG. 7.

FIG. 8 shows a block diagram of the voltage-controlled delay line 73 in FIG. 7. Referring to FIG. 8, a typical voltage-controlled delay line 73 is formed by a plurality of serially coupled voltage-controlled inverters 731, where the first inverter 731 receives the reference signal $F_{ref}$ and the last inverter 731 outputs the output clock $F_{out}$. Each inverter is under the control of the control voltage Vctl.

Figure 9:
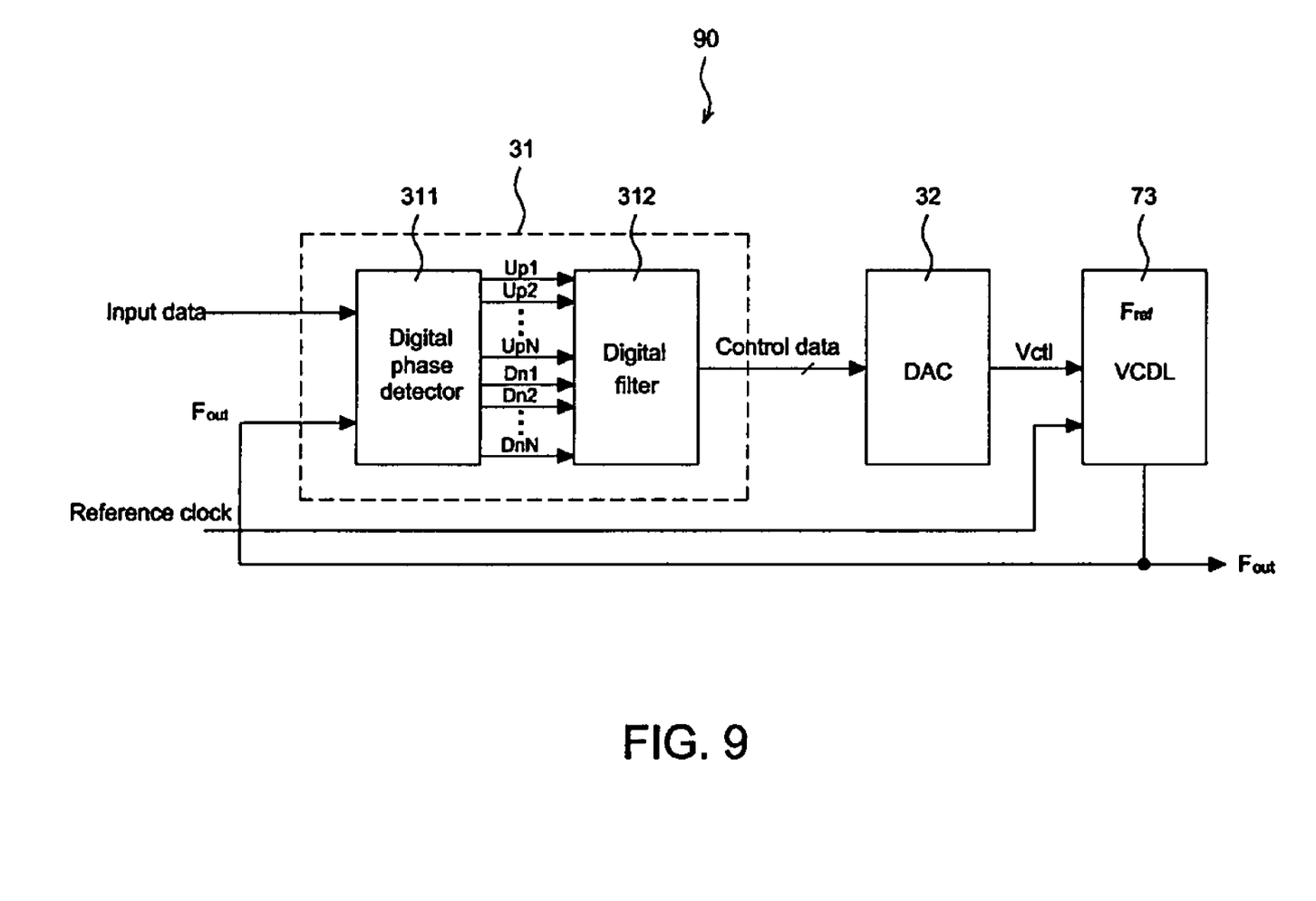
FIG. 9 shows a block diagram illustrating another DLL according to the invention.

FIG. 9 shows a block diagram illustrating another embodiment of the DLL. The DLL shown in FIG. 9 is applied to a data recovery circuit, and it is similar to the DLL shown in FIG. 7, except that the input signals for the phase detector 311 are replaced with the input data of the data recovery circuit, and that the reference clock of the voltage-controlled delay line 73 is inputted separately.

While the invention has been described by way of examples and in terms of the preferred embodiments, it is to be understood that the invention is not limited to the disclosed embodiments. To the contrary, it is intended to cover various modifications and similar arrangements as would be apparent to those skilled in the art. Therefore, the scope of the appended claims should be accorded the broadest interpretation so as to encompass all such modifications and similar arrangements.

What is claimed is:

1. A circuit for detecting a phase error of a first signal and a second signal to generate control data, comprising:
    a digital phase detector for receiving the first signal and the second signal to generate a set of phase error control signals according to a difference between the first signal and the second signal; and
    a digital filter, coupled to the digital phase detector, for generating the control data according to the phase error control signals, the digital filter comprising:
        a lookup table for receiving the phase error control signals and outputting a lookup value;
        an adder for receiving the lookup value and a register value and generating the control data; and
        a register for receiving and storing the control data and outputting the stored control data as the register value.

2. The circuit of claim 1, wherein the digital filter performs low-pass filtering operations on the phase error control signals.

3. The circuit of claim 1, wherein the lookup table is implemented on a memory, and the phase error signals are address signals.

4. The circuit of claim 1, wherein the lookup table comprises a plurality of logic gates, and the lookup value is generated according to the phase error control signals.

5. The circuit of claim 1, wherein the circuit is applied to a phase-locked loop (PLL).

6. The circuit of claim 1, wherein the circuit is applied to a delay-locked loop (DLL).

7. The circuit of claim 1, further comprising:
    a digital-to-analog converter, coupled to the digital filter, for converting the control data into a control signal.

8. An apparatus for generating an oscillation signal, the apparatus comprising:
    a voltage-controlled signal generator for generating the oscillation signal according to a control voltage;
    a digital phase detector for receiving the oscillation signal and a reference signal to generate a set of phase error control signals according to a difference between the oscillation signal and the reference signal;
    a digital filter, coupled to the digital phase detector, for generating control data according to the phase error control signals, the digital filter comprising:
        a lookup table for receiving the phase error control signals and outputting a lookup value;
        an adder for receiving the lookup value and a register value and generating the control data; and
        a register for receiving and storing the control data and outputting the stored control data as the register value; and
    a digital-to-analog converter, coupled to the digital filter, for converting the control data into the control voltage.

9. The apparatus of claim 8, wherein the voltage-controlled signal generator is a voltage-controlled oscillator (VCO).

10. The apparatus of claim 9 is a phase-locked loop (PLL).

11. The apparatus of claim 8, wherein the voltage-controlled signal generator is a voltage controlled delay line (VCDL).

12. The apparatus of claim 11 is a delay-locked loop (DLL).

13. A method for generating a control signal, the method comprising:
    receiving an input signal and a reference signal;
    detecting a difference between the input signal and the reference signal to produce a set of phase error control signals;
    outputting a lookup value according to the phase error control signals;
    summing the lookup value and a register value to generate a control data;
    storing the control data, wherein the stored control data is served as the register value; and
    converting the control data into a control signal.

14. The method of claim 13, further comprising the step of:
    performing low-pass filtering operations on the phase error control signals.

15. The method of claim 13 is applied to a phase-locked loop (PLL).

16. The method of claim 13 is applied to a delay-locked loop (DLL).

17. A circuit for detecting a phase error of a first signal and a second signal to generate control data, comprising:
    a digital phase detector for receiving the first signal and the second signal to generate a set of phase error control signals according to a difference between the first signal and the second signal; and
    a digital filter, coupled to the digital phase detector, for generating the control data according to the phase error control signals, the digital filter comprising:
        a lookup table for receiving the phase error control signals and outputting a lookup value; and
        a calculating unit for generating the control data according to the lookup value.

18. The circuit of claim 17, wherein the calculating unit is an integrator to perform low-pass filtering operations on the phase error control signals.

19. The circuit of claim 17, wherein the calculating unit comprises:
    an adder for receiving the lookup value and a register value and generating the control data; and
    a register for receiving and storing the control data and outputting the stored control data as the register value.

20. The circuit of claim 17, wherein the lookup table is implemented on a memory, and the phase error signals are address signals.

21. The circuit of claim 17, wherein the lookup table comprises a plurality of logic gates, and the lookup value is generated according to the phase error control signals.

22. The circuit of claim 17, wherein the circuit is applied to a phase-locked loop (PLL).

23. The circuit of claim 17, wherein the circuit is applied to a delay-locked loop (DLL).

24. The circuit of claim 17, further comprising:
a digital-to-analog converter, coupled to the digital filter, for converting the control data into a control signal.

25. An apparatus for generating an oscillation signal, the apparatus comprising:
a voltage-controlled signal generator for generating the oscillation signal according to a control voltage;
a digital phase detector for receiving the oscillation signal and a reference signal to generate a set of phase error control signals according to a difference between the oscillation signal and the reference signal;
a digital filter, coupled to the digital phase detector, for generating control data according to the phase error control signals, the digital filter comprising:
a lookup table for receiving the phase error control signals and outputting a lookup value; and
a calculating unit for generating the control data according to the lookup value; and
a digital-to-analog converter, coupled to the digital filter, for converting the control data into the control voltage.

26. The apparatus of claim 25, wherein the calculating unit comprises:
an adder for receiving the lookup value and a register value and generating the control data; and
a register for receiving and storing the control data and outputting the stored control data as the register value.

27. The apparatus of claim 25, wherein the calculating unit is an integrator to perform low-pass filtering operations on the phase error control signals.

28. The apparatus of claim 25, wherein the voltage-controlled signal generator is a voltage-controlled oscillator (VCO).

29. The apparatus of claim 28, is a phase-locked loop (PLL).

30. The apparatus of claim 25, wherein the voltage-controlled signal generator is a voltage controlled delay line (VCDL).

31. The apparatus of claim 30 is a delay-locked loop (DLL).

* * * * *